United States Patent [19]
Jewell et al.

[11] Patent Number: 5,295,147
[45] Date of Patent: Mar. 15, 1994

[54] VERTICAL CAVITY, SURFACE-EMITTING LASER WITH EXPANDED CAVITY

[75] Inventors: Jack L. Jewell; Greg R. Olbright, both of Boulder, Colo.

[73] Assignee: Photonics Research Incorporated, Longmont, Colo.

[21] Appl. No.: 994,976

[22] Filed: Dec. 22, 1992

[51] Int. Cl.$^5$ .................................................. H01S 3/19
[52] U.S. Cl. ........................................ 372/45; 372/98
[58] Field of Search .................. 372/7, 9, 43, 44, 45, 372/49, 50, 98, 99, 103

[56] References Cited

U.S. PATENT DOCUMENTS

| | | | |
|---|---|---|---|
| 5,073,041 | 12/1991 | Rastani | 385/33 |
| 5,125,054 | 6/1992 | Ackley et al. | 385/49 |
| 5,164,949 | 11/1992 | Ackley et al. | 372/45 |

*Primary Examiner*—Frank Gonzalez
*Attorney, Agent, or Firm*—Fisher & Associates

[57] ABSTRACT

A vertical-cavity, surface-emitting semiconductor laser having a substrate, an active layer of a semiconductor material which is adapted to generate light on a surface of the substrate, a pair of mirrors at opposite sides of the active layer and means for expanding the diameter of the output beam. Such means include a spacer layer of an optically passive material between the active layer and at least one of the mirrors, and mirror layers of reduced difference in index of refraction, interface layers having intermediate indices of refraction placed between mirror layers, in either case expanding the effective optical cavity length to at least 100 times the thickness of the active material in the active layer. Another means is anti-waveguiding which directly expands the diameter of the beam. The expanded cavity provides an output beam of larger diameter while maintaining stable single mode emission. The spacer layer may be a separate layer or region over the substrate or at least a portion of the substrate.

52 Claims, 2 Drawing Sheets

VERTICAL CAVITY, SURFACE-EMITTING LASER WITH EXPANDED CAVITY

This invention was made with Government support under Contract Number F49620-92-C-0053 awarded by the Air Force and the Advanced Research Projects Agency. The Government has certain rights in this invention.

BACKGROUND OF THE INVENTION

1. Field of the Invention

The present invention relates to a semiconductor vertical-cavity, surface-emitting laser, and, more particularly, to a semiconductor vertical-cavity, surface-emitting laser having an expanded cavity to increase the power of the emitted beam of light while maintaining the beam in a single transverse mode.

2. Description of the Prior Art

Semiconductor laser diodes, in general, comprise a body of a semiconductor material having adjacent regions of opposite conductivity type forming a p-n junction therebetween. The body is adapted to generate and emit radiation when an appropriate potential is applied across the p-n junction. Vertical-cavity, surface-emitting lasers (VCSELs) emit radiation in a direction perpendicular to the plane of the p-n junction or substrate rather than parallel to the plane of the p-n junction as in the case of conventional edge-emitting diode lasers. In contrast to the astigmatic beam quality of conventional edge emitting lasers, VCSELs advantageously emit a circularly symmetric Gaussian beam and thus do not require anamorphic correction. VCSELs, moreover, can readily be made into two-dimensional laser arrays as well as be fabricated in extremely small sizes. Accordingly, two-dimensional VCSEL arrays have various applications in the fields of optical interconnection, integrated optoelectronic circuits and optical computing, optical memory, optical communications, laser printing, scanning, etc.

To achieve a low threshold current, VCSELs typically utilize a thin active region on the order of $\lambda/4n$ thick or less, where $\lambda$ is the wavelength of the emitted light and n is the index of refraction of the active region. With such a thin active region, however, VCSELs have a single pass optical gain of approximately 1% or less, thereby requiring the use of end mirrors having reflectivities greater than 99% to achieve lasing. Such a high reflectivity is normally achieved by employing epitaxially grown semiconductor distributed Bragg reflector (DBR) mirrors. Also, mirrors have been made employing multilayers of dielectric materials. Penetration of the light intensity into multilayer mirrors gives rise to an effective optical cavity length which is somewhat longer than the length of the material between the mirrors. Much of the prior art describes VCSELs with effective optical cavity length not much larger than the optical thickness of the active material, and in all cases the ratio of the effective optical cavity length to the active material thickness of the active material, and in all cases the ratio of the effective optical cavity length to the active material optical thickness is less than 100. Optical lengths are well known as being the physical length multiplied by the refractive index of the material. For the case of heterostructures, the optical length is the sum of the products of physical lengths times refractive indices. A precise and general technique for evaluating the effective optical cavity length is described in an article by J. Jewell et al., entitled "High-finesse (Al,Ga) As interference filters grown by molecular beam epitaxy." published in *Applied Physics Letters*, Vol. 53(8), Aug. 22, 1988, pgs. 640-642. The optical thickness of the active material in the cases of bulk or superlattice semiconductors, is straightforwardly the refractive index multiplied by the physical thickness. In the case of quantum well active material, the physical thickness does not include the barrier material between the wells. Penetration of the light intensity into the multilayer mirrors can be increased, thereby increasing the effective optical cavity length, by choosing mirrors layers whose differences in indices of refraction are smaller. Another means for increasing the penetration of light intensity into the mirrors, thereby increasing the effective optical cavity length, is to introduce materials having intermediate indices or refraction between the layers of high and low index of refraction. A laser having both a semiconductor mirror and a dielectric mirror is described in an article by K. Mori et al, entitled "Effect of cavity size on lasing characteristics of a distributed Bragg reflector-surface emitting laser with buried heterostructure", published in *Applied Physics Letters*, Vol. 60(1), Jan. 6, 1992, pgs. 21-22.

Unfortunately, the applicability of vertical-cavity, surface-emitting lasers is severely limited by its low power output. Single transverse mode emission at current significantly above threshold, e.g. $>20$ milliamps, for beams having a diameter well below 10 micrometers have been reported. However, attempts to provide a beam of greater diameter have resulted in a laser going multimode at low currents, e.g. $<15$ milliamps. Therefore, it would be desirable to have a vertical-cavity, surface-emitting laser which emits a large diameter beam in a low-order transverse mode to provide a beam having increased power.

SUMMARY OF THE INVENTION

The present invention relates to a vertical-cavity, surface emitting laser which comprises a body of a semiconductor material having an active region therein which is adapted to generate radiation and emit the radiation from a surface of the body. A separate mirror is along each side of the active region between the active region and a surface of the body. One form of the invention utilizes a spacer region between the active region and at least one of the mirrors to expand the effective optical cavity length to at least 100 times the optical thickness of the active region and increase the size of the emitted beam of radiation. Another form of the invention utilizes decreased differences in index of refraction in the mirror layers to increase mirror penetration and thereby expand the effective optical cavity length to at least 100 times the optical thickness of the active region and increase the size of the emitted beam of radiation. Still another form of the invention utilizes materials having intermediate indices of refraction between the mirror layers of high and low index of refraction to increase mirror penetration and thereby expand the effective optical cavity length to at least 100 times the optical thickness of the active material in the region and increase the size of the emitted beam of radiation. Yet another form of the invention utilizes anti-waveguiding to increase the diameter of the emitted beam of radiation.

BRIEF DESCRIPTION OF THE DRAWINGS

The invention will be further described in conjunction with the accompanying drawings, in which.

DETAILED DESCRIPTION OF PREFERRED EMBODIMENTS

Figure 1:
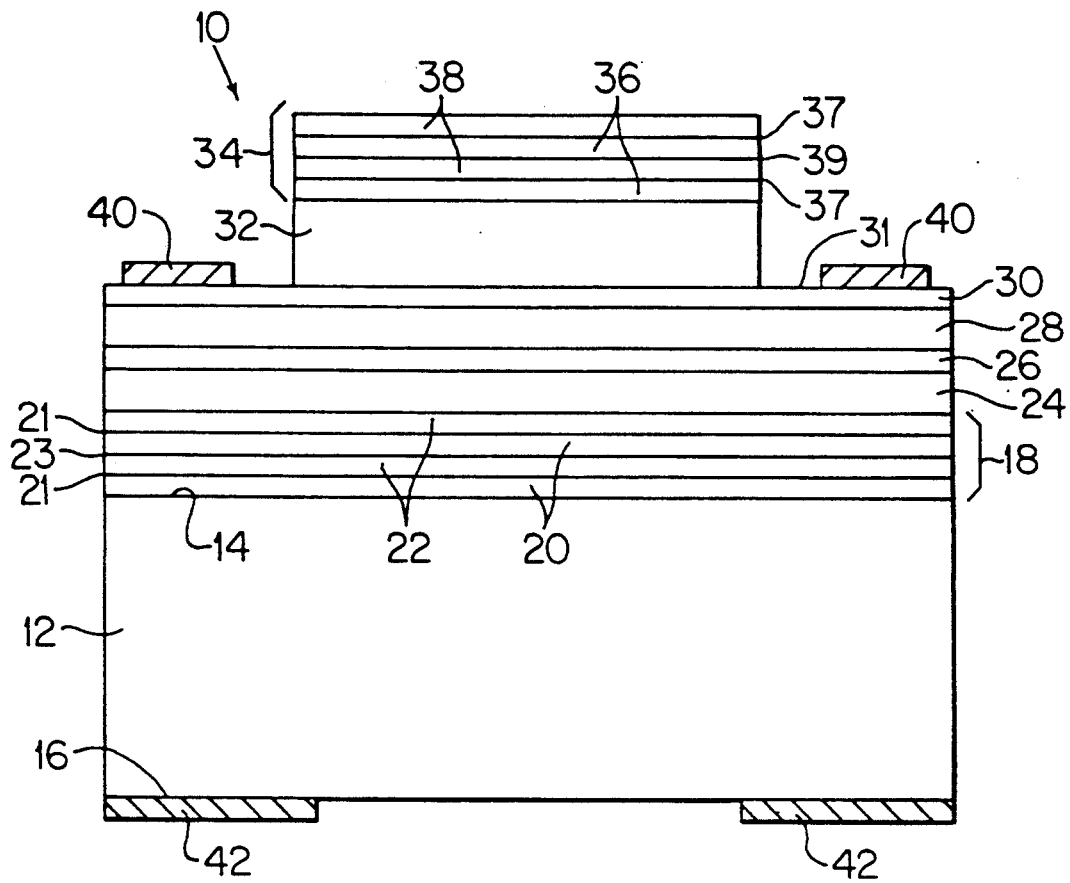
FIG. 1 is a sectional view through one form of a vertical-cavity, surface-emitting laser in accordance with the present invention.

Referring initially to FIG. 1, there is shown a sectional view of a vertical-cavity, surface-emitting laser 10 in accordance with the present invention. Laser 10 comprises a substrate 12 of a semiconductor material, such as GaAs, of one conductivity type, such as n-type, having opposed major surfaces 14 and 16. On the surface 14 of the substrate is a first mirror 18 formed of alternating layers 20 and 22 of materials having different indices of refraction with interfaces 21 and 23 between them. Preferably, the first mirror 18 is a distributed Bragg reflector formed of alternating layers 20 and 22 of high and low index of refraction semiconductor materials which are also electrically conductive. Although first mirror 18 is designed to be reflective, it can also be designed to be partially transparent to light.

On the first mirror 18 is a first clad layer 24 of a semiconductor material of the same conductivity type as the substrate 12. On the first clad layer 24 is a thin active layer 26 containing active material, and on the active layer 26 is a second clad layer 28. The second clad layer 28 is of similar material as the first clad layer 24 but of opposite conductivity type. The active layer 26 may be of a single semiconductor material, nonconductive or of either conductivity type, or may be of a single or multiple quantum well structure or may be of a superlattice structure. The first and second clad layers 24 and 28 are of materials having bandgaps different from that of the active layer 26 so as to confine electrons to the active layer 26. On the second clad layer 28 is a contact layer 30 of a semiconductor material of the same conductivity type as the second clad layer 28. Contact layer 30 may be homogeneous or heterogeneous. In either case the structure of contact layer and its surface 31 may produce substantial reflectivity which can contribute to the reflectivity of the laser cavity on the same side of the active layer 26 as the second mirror 34.

On at least a portion of the contact layer 30 is a spacer layer 32 of a material which is optically passive. The spacer layer 32 may be of a dielectric material, such as titanium dioxide or silicon dioxide, a semiconductor material, such as aluminum gallium arsenide, or partly of a dielectric material and partly of a semiconductor material. The spacer layer 32 may also be a space containing air or a vacuum. In some embodiments, the spacer layer 32 should be of sufficient thickness such that the effective optical cavity length of laser 10 is at least 100 times the optical thickness of the active layer 26. Space layer 32 may be homogeneous or heterogeneous. In either case the structure of spacer layer 32 may produce substantial reflectivity which can contribute to the reflectivity of the laser cavity on the same side of the active layer as second mirror 34.

On the spacer layer 32 is a second mirror 34. The second mirror 34 is also formed of alternating layers 36 and 38 of materials having different indices of refraction with interfaces 37 and 39 between them. Although the second mirror 34, like the first mirror 18 may be formed of semiconductor materials, it can also be made of dielectric materials, in either case having the high and low indices of refraction. Second mirror 34 may also be at least partially metallic. Although the second mirror 34 is designed to be reflective, it may also be designed to be partially transparent to light. Second mirror 34 may be planar, it may be curved, either concave or convex. In another embodiment of the invention, the spacer layer 32 may be of negligible thickness, in which case the effective optical cavity length is expanded to be at least 100 times the optical thickness of the active material in the active layer 26 by utilizing a decreased difference between the indices of refraction of mirror layers 20 and 22 or mirror layers 36 and 38. In still another embodiment of the invention, the spacer layer 32 may be of negligible thickness, in which case the effective optical cavity length is expanded to be least 100 times the optical thickness of the active layer 26 by utilizing interfaces 21 and 23 of finite thickness with material composition to have one or more indices of refraction intermediate between the indices of refraction of alternating layers 20 and 22, or interfaces 37 and 39 of finite thickness with material composition to have one or more indices of refraction intermediate between the indices of refraction of alternating layers 36 and 38. On the surface of the contact layer 30 at each side of or around the spacer layer 32 is a contact 40. On the surface 16 of the substrate 12 is a contact 42. The contacts 40 and 42 are of a conductive material, such as a metal or multilayers of different metals suitable for providing ohmic contact to the contact layer 30 and substrate 12 respectively.

In the operation of the laser 10, a current is passed through the laser 10 between the contacts 40 and 42. This generates light in the active layer 26. The light is reflected back and forth between the first and second mirrors 18 and 34 to achieve lasing of the light. Since at least one of the mirrors, for example the second mirror 34, is also partially transparent, some of the lasing light will pass out of the laser 10 through the mirror which is partially transparent. The spacer layer 32 being of an optically passive material, causes the optical cavity formed between the first and second mirrors 18 and 34 to be expanded. This expansion of the optical cavity results in the increase in the diameter of the light beam emitted by the laser 10. By having the spacer layer 32 of a thickness such that the effective optical cavity length is greater than 100 times the optical thickness of active material in active layer 26, there is achieved a light beam of greater diameter while maintaining stable single transverse mode operation. The increase in the diameter of the emitted beam of light provides a beam of greater power.

Figure 2:
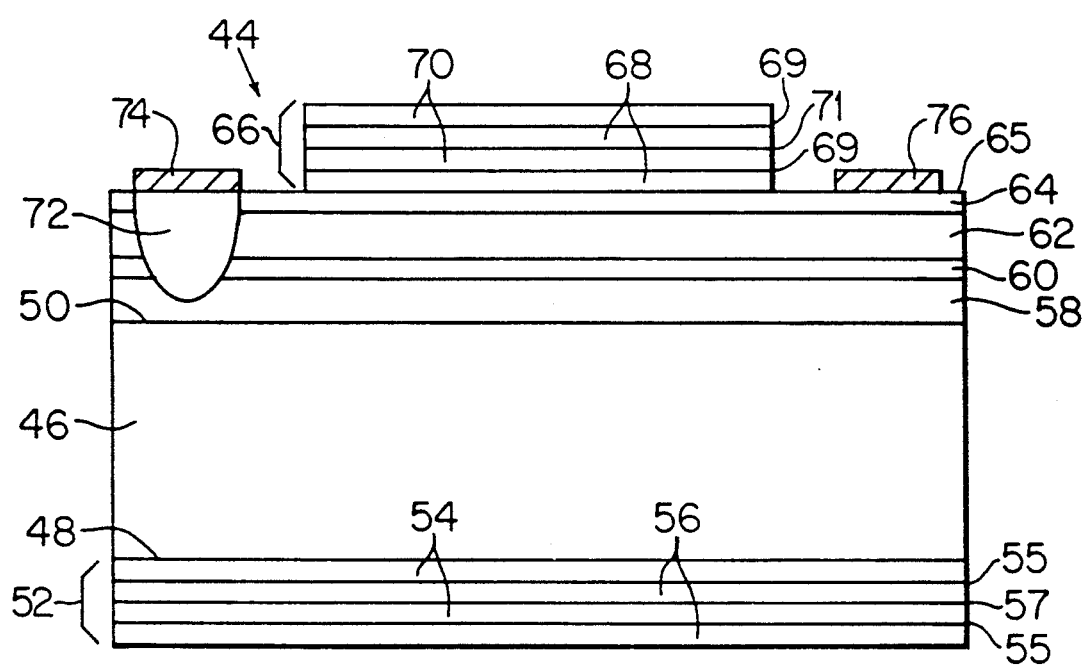
FIG. 2 is a sectional view through another form of a vertical-cavity, surface-emitting laser in accordance with the present invention.

Referring now to FIG. 2, there is shown another form of vertical-cavity, surface-emitting semiconductor laser 44. Laser 44 comprises a substrate/spacer 46 of an optically passive material having opposed major surfaces 48 and 50. The substrate/spacer may be of a semiconductor material, a dielectric material or a combination of the two materials, and may be conductive to accommodate the flow of electrical current. On the surface 48 of the substrate/spacer 46 is a first mirror 52.

First mirror 52 is formed of alternating layers 54 and 56 of materials having different indices of refraction with interfaces 55 and 57 between them. The first mirror 52 may be made of layers of different semiconductor materials and/or different dielectric materials. First mirror 52 may also be at least partially metallic. Although first mirror 52 is designed to be reflective it can also be designed to be partially transparent to light. First mirror 52 may be planar, or it may be curved, either concave or convex. In some embodiments, the substrate/spacer 46 should be of sufficient thickness such that the effective optical cavity length of laser 44 is at least 100 times the optical thickness of the active material in active layer 60. Substrate/spacer 46 may be homogeneous or heterogeneous. In either case the structure of substrate/spacer 46 may produce substantial reflectivity which can contribute to the reflectivity of the laser cavity on the same side of the active layer 60 as first mirror 52.

On the surface 50 of the substrate/spacer 46 is a first clad layer 58 of a semiconductor material of one conductivity type. On the first clad layer 58 is a thin active layer 60 of a semiconductor material containing active material. On the active layer 60 is a second clad layer 62 of a semiconductor material of the opposite conductivity type. The active layer 60 may be of either conductivity type or of a single or multiple quantum well structure or of a superlattice structure. The first and second clad layers 58 and 62 are of the same semiconductor material which has a band gap different from that of the active layer 60 so as to confine electrons to the active layer 60. On the second clad layer 62 is a contact layer 64 of a conductive semiconductor material of the same conductivity type as the second clad layer 62. Contact layer 64 may be homogeneous or heterogeneous. In either case the structure of contact layer and its surface 65 may produce substantial reflectivity which can contribute to the reflectivity of the laser cavity on the same side of the active layer as second mirror 66.

A second mirror 66 is on a portion of the contact layer 64. Second mirror 66 is formed of alternating layers 68 and 70 of materials having different indices of refraction and interfaces 69 and 71 between them. Like the first mirror 52, the second mirror 66 may be formed of alternating layers 68 and 70 of different semiconductor materials or different dielectric materials. Although the second mirror 66 is formed to be reflective, it may also be formed to be partially transparent to the light generated by the laser 44. Second mirror 66 may also be at least partially metallic. Second mirror 66 may be flat, or it may be curved either concave or convex. In another embodiment of the invention, the substrate/spacer 46 may be of negligible thickness, in which case the effective optical cavity length is expanded to be at least 100 times the optical thickness of the active material in active layer 60 by utilizing a decreased difference between the indices of refraction of mirror layers 54 and 56 or mirror layers 68 and 70. In still another embodiment of the invention, substrate/spacer 46 may be of negligible thickness, in which case the effective optical cavity length is expanded to be at least 100 times the optical thickness of the active material in active layer 60 by utilizing interfaces 55 and 57 of finite thickness with material composition to have one or more indices or refraction intermediate between the indices of refraction of alternating layers 54 and 56, or interfaces 69 and 71 of finite thickness with material composition to have one or more indices of refraction intermediate between the indices of refraction of alternating layers 68 and 70.

A highly conductive contact region 72 of the same conductivity type as the first clad layer 58 extends through the contact layer 64, the second clad layer 62, the active layer 60 and into the first clad layer 58. The contact region 72 serves as a contact to the first clad layer 58. A conductive contact 74 is on the contact region 72 and a conductive contact 76 is on the contact layer 64. The contacts 74 and 76 are of a conductive metal or multilayers of metals which are suitable to form ohmic contact to the contact region 72 and contact layer 64 respectively.

In the operation of the laser 44, a current is passed through the laser 44 between the contacts 72 and 74. The current passing across the active layer 60 results in the generation of light. The light is reflected back and forth between the first and second mirrors 52 and 66 to create lasing of the light. Since at least one of the mirrors is partially transparent, some of the lasing light will be emitted from the laser 44 through the partially transparent mirror(s). Since the substrate/spacer 46 is optically passive, it expands the optical cavity in the laser 44 between the mirrors 52 and 66. This creates an emitted beam of light having a larger diameter so as to increase the power of the emitted beam of light. By having the substrate/spacer 46 of a thickness such that the effective optical cavity length is greater than 100 times the optical thickness of the active material in active layer 60, an increase in the diameter of the emitted beam of light is achieved while maintaining stable single mode emission.

Figure 3:
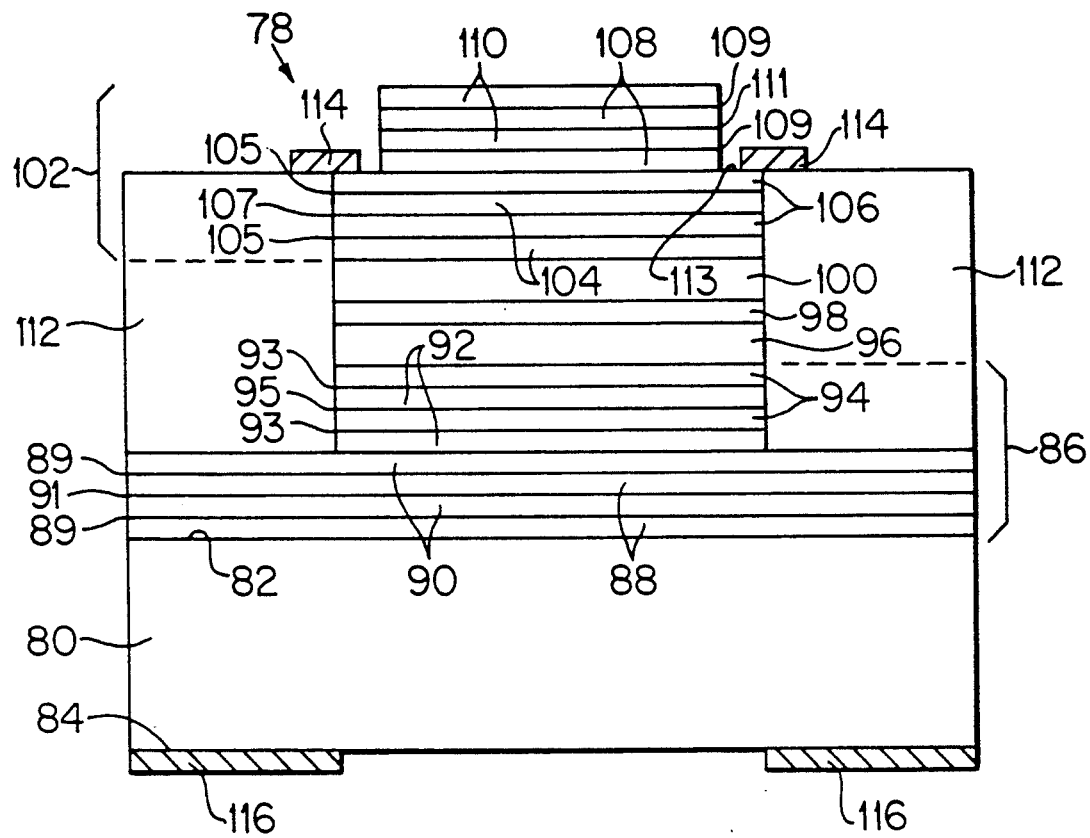
FIG. 3 is a sectional view through still another form of a vertical-cavity surface-emitting laser in accordance with the present invention.

Referring now to FIG. 3, there is shown still another form of vertical-cavity surface-emitting laser 78. Laser 78 comprises a substrate 80 of a semiconductor material such as GaAs, of one conductivity type, such as n-type, having opposed major surfaces 82 and 84. One the surface 82 of the substrate is a first mirror 86 formed or alternating layers 88 and 90 with interfaces 89 and 91 between them, and additional alternating layers 92 and 94 with interfaces 93 and 95 between them. Preferably, first mirror 86 is a distributed Bragg reflector formed of alternating layers 88 and 90 and alternating layers 92 and 94 of high and low index of refraction semiconductor materials which are also electrically conductive. In some embodiments, layers 88 and 92 will be identical, and layers 90 and 94 will be identical. Although first mirror 86 is designed to be reflective, it can also be designed to be partially transparent to light.

On first mirror 86 is a first clad layer 96 of the same conductivity type as first mirror 86. One the first clad layer 96 is a thin active layer 98 containing active material, and on active layer 98 is a second clad layer 100. The second clad layer 100 is of similar material as the first clad layer 96 but of opposite conductivity type. The active layer 98 may be of a single semiconductor material, nonconductive or of either conductivity type, or may be of a single or multiple quantum well structure or may be of a superlattice structure. The first and second clad layers 96 and 100 are of materials having bandgaps different from that of the active layer 98 so as to confine electrons to the active layer 98.

On the contact layer 100 is a second mirror 102. The second mirror is also formed of alternating layers 104 and 106 with interfaces 105 and 107 between them, and additional alternating layers 108 and 110 with interfaces 109 and 111 between them. Preferably, second mirror 102 is a distributed Bragg reflector formed of alternating layers 104 and 106 and alternating layers 108 and 110 of materials having different indices of refraction. Preferably, mirror layers 104 and 106 are conductive.

Mirror layers 108 and 110 may or may not be conductive. In some embodiments, layers 104 and 108 will be identical, and layers 106 and 110 will be identical. Second mirror 102 may also be at least partially metallic. Although the second mirror 102 is designed to be reflective, it can also be designed to be partially transparent to light. Surrounding at least part of first mirror 86, first clad layer 96, active layer 98, second clad layer 100, or at least part of second mirror 102, or any combination thereof, is cladding 112. Cladding 112 is anti-waveguiding by having a refractive index greater than the average refractive index of layers 92 and 94, or greater than the average refractive index of layers 104 and 106. On mirror layer 106 is a thin contact layer 113. One the surface of the contact layer 113 is a contact 114. In other embodiments, contact layer 113 and contact 114 will be placed on top of mirror layer 110. On surface 84 of the substrate 80 is a contact 116. The contacts 114 and 116 are of conductive materials, such as metals or multilayers of different metals suitable for providing ohmic contact to the contact layer 113 and substrate 80 respectively.

In the operation of the laser 78, a current is passed through the laser 78 between the contacts 114 and 116. This generates light in the active layer 98. The light is reflected back and forth between the first and second mirrors 86 and 102 to achieve lasing of the light. Since at least one of the mirrors, for example the second mirror 102, is also partially transparent, some of the lasing light will pass out of the laser 78 through the mirror which is partially transparent. Since the cladding 112 surrounding at least part of first mirror 86, first clad layer 96, active layer 98, second clad layer 100 or at least part of second mirror 102, is anti-waveguiding, the diameter of the optical beam reflecting back and forth between the first and second mirrors 86 and 102 is expanded. By expanding the beam diameter, single transverse mode operation is stable at greater power.

Thus, there is provided by the present invention a vertical-cavity, surface emitting diode laser in which the optical cavity is expanded either by providing a spacer region of an optically passive material between the active layer of the diode laser and a mirror at one surface of the laser or by providing an anti-waveguiding structure. This expansion of the optical cavity provides a beam of light of larger diameter while maintaining stable single mode operation.

It is to be appreciated and understood that the specific embodiments of the invention are merely illustrative of the general principles of the invention. Various modifications may be made consistent with the principles set forth. For example, although the spacer layer has been shown at only one side of the active layer, a separate spacer layer can be provided at both sides of the active layer. Also, the particular materials used for the mirrors may vary as long as the indices of refraction of the layers provided the desired reflection and/or partial transparency. In addition, the materials used for spacer layer may vary as long as the material is optically inactive. In some cases the spacer may be conductive to aid in the injection of current into the active layer. Although the spacers are optically passive, in some cases the spacers may be electrically active, for example the spacers could contain at least part of an electrical device such as a transistor. Features from the lasers FIGS. 1, 2, and 3 can be combined or interchanged. For example, any of the lasers can have both electrical contacts on one side of the active layer or have electrical contacts on opposing sides of the contact layer by having the appropriate doping and conductivity in the laser structure. Although is it not explicitly shown in the figures, one or both of the contacts could be on the very top of the structure. Presence of the electrical contacts does not imply that they must be used, for example the laser could be pumped optically rather than electrically. An anti-waveguiding structure can be combined with either or both of the spacers described. It is contemplated that any embodiment of the invention may be used in arrays of more than one laser element. In some array configurations, light from one laser may affect the light of another laser, either through lateral overlap, or by providing the appropriate thickness spacer such that the beam from one laser element, upon reflecting from one of the mirrors, interacts favorably with another element. In such cases there is the possibility of at least a partial locking of the phases of the light waves of the laser elements. It is also to be understood that "optically passive material" refers to material which does not significantly emit light under normal operating conditions. "Active material in the active layer" is distinguished from "active layer" only in the case of multiple quantum wells, in which case the barrier material between the wells is not included in the "active material in the active layer."

What is claimed is:

1. A vertical-cavity, surface-emitting diode laser comprising:
   a body of a semiconductor material having opposed surfaces and an active region therein which is adapted to generate light and emit the light from one of the surfaces thereof;
   a separate reflecting mirror at opposite sides of the active region, at least one of the mirrors comprising alternating layers of at least two materials having different indices of refraction, at least one of the mirrors being partially transparent to the generated light to allow the light generated in the active region to be emitted therethrough; and
   optically passive means for expanding the optical cavity of the body and thereby emit a light beam of larger diameter.

2. The diode laser of claim in which the optically passive means comprises at least one spacer layer between the active region and at least one of the mirrors of sufficient total thickness, such that the effective optical cavity length of the laser is at least 100 times the thickness of the active material in the active region.

3. The diode laser of claim 1 in which the optically passive means comprises at least one spacer layer between the active region and at least one of the mirrors of sufficient total thickness, such that the effective optical cavity length of the laser is at least 200 times the thickness of the active material in the active region.

4. The diode laser of claim 1 in which the optically passive means comprises a spacer layer between the active region and at least one of the mirrors at least 10 micrometers in thickness.

5. The diode laser of claim 1 in which the optically passive means comprises a spacer layer of semiconductor material between the active region and at least one of the mirrors of sufficient thickness such that the effective optical cavity length of the laser is at least 100 times the optical thickness of the active material in the active region.

6. The diode laser of claim 1 in which the optically passive means comprises a spacer layer of a dielectric material between the active region and at least one of the mirrors of sufficient thickness such that the effective optical cavity length of the laser is at least 100 times the optical thickness of the active material in the active region.

7. The diode laser of claim 1 in which the optically passive means comprises a spacer layer between the active region and at least one of the mirrors of a combination of a semiconductor material and a dielectric material of sufficient thickness such that the effective optical cavity length of the laser is at least 100 times the optical thickness of the active material in the active region.

8. The diode laser of claim 1 in which the optically passive means comprises a spacer region of air between the active region and at least one of the mirrors of sufficient thickness such that the effective optical cavity length of the laser is at least 100 times the optical thickness of the active material in the active region.

9. The diode laser is claim 1 in which the optically passive means comprises a spacer region under a vacuum between the active region and at least one of the mirrors of sufficient thickness such that the effective optical cavity length of the laser is at least 100 times the optical thickness of the active material in the active region.

10. The diode laser of claim 1 in which the optically passive means comprises at least one mirror in which the difference in indices of refraction of the layers are reduced such that the effective optical cavity length of the laser is increased to be at least 100 times the thickness of the active material in the active region.

11. The diode laser of claim 1 in which the optically passive means comprises at least one spacer layer between the active region and at least one mirror in which the difference in indices of refraction of the layers are reduced, such that the effective optical cavity length of the laser is increased to be at least 100 times the thickness of the active material in the active region.

12. The diode laser of claim 1 in which the optically passive means comprises at least one interface layer in at least one mirror to increase the light penetration into the mirror such that the effective optical cavity length of the laser is increased to be at least 100 times the thickness of the active material in the active region.

13. The diode laser of claim 1 in which the optically passive means comprises at least one spacer layer between the active region and at least one interface layer in at least one mirror, such that the effective optical cavity length of the laser is increased to be at least 100 times the thickness of the active material in the active region.

14. The diode laser of claim 1 in which the optically passive means comprises at least one mirror in which the difference in indices of refraction of the layers are reduced, and at least one interface layer in at least one mirror, such that the effective optical cavity length of the laser is increased to be at least 100 times the thickness of the active material in the active region.

15. The diode laser of claim 1 in which the optically passive means comprises at least one spacer layer between the active region, and at least one mirror in which the difference in indices of refraction of the layers are reduced, and at least one interface layer in at least one mirror, such that the effective optical cavity length of the laser is increased to be at least 100 times the thickness of the active material in the active region.

16. The diode laser of claim 1 further comprising electrical contacts and means for injecting electrical current from the electrical contacts to the active region, in which both electrical contacts are on the same side of the active region.

17. The diode laser of claim 1 further comprising electrical contacts and means for injecting electrical current from the electrical contacts are on opposing sides of the active region.

18. The diode laser of claim 2 in which the spacer layer contains at least part of a electronic device.

19. The diode laser of claim 14 in which the electronic device is a transistor, phototransistor, photothyristor, or a detector.

20. A vertical-cavity, surface-emitting diode laser comprising:
   a substrate having opposed major surfaces;
   a plurality of layers of a semiconductor material on one of the surfaces of the substrate, said layers including an active layer which is adapted to generate light;
   a pair of mirrors on said substrate one at each of opposite sides of the active layer, said mirrors being reflective to the light generated by the active region with at least one of the mirrors being at least partially transparent to the light; and
   optically passive means for expanding the optical cavity of the semiconductor layers and thereby emit a light beam of larger diameter.

21. The diode laser of claim 20 in which the optically passive means comprises a spacer layer of an optically passive material over at least a portion of the active layer and between the active layer and at least one of the mirrors with sufficient thickness such that the effective optical cavity length of the laser is at least 100 times the optical thickness of the active material in the active layer.

22. The diode laser of claim 21 in which the optically passive means comprises a spacer layer of a semiconductor material, a dielectric material or a combination of a semiconductor material and a dielectric material.

23. The diode laser of claim 22 in which one of the mirrors is on a surface of the substrate, the layers of the semiconductor material are on the one mirror, the spacer layer is on the layers of semiconductor material and the other mirror is on the spacer layer.

24. The diode laser of claim 23 in which at least one of the mirrors comprises alternating layers of at least two materials having different indices of refraction.

25. The diode laser of claim 23 in which the semiconductor layers comprise a pair of clad layers of opposite conductivity type and an active layer between the clad layers.

26. The diode laser of claim 25 further comprising a highly conductive semiconductor contact layer on one of the clad layers and the spacer layer is on the contact layer.

27. The diode laser of claim 26 further comprising separate conductive contacts on the contact layer and the other surface of the substrate.

28. The diode laser of claim 20 in which the optically passive means comprises at least a portion of the substrate which portion is of sufficient thickness such that the effective optical cavity length of the laser is at least 100 times the optical thickness of the active material in the active layer.

29. The diode laser of claim 28 in which the substrate is of an optically passive semiconductor material, a dielectric material or a combination of a semiconductor material and a dielectric material.

30. The diode laser of claim 28 in which one mirror is on one surface of the substrate, the semiconductor layers are on the other surface of the substrate and the other mirror is on the semiconductor layers.

31. The diode laser of claim 30 in which each of the mirrors comprises alternating layers of two materials having different indices of refraction.

32. The diode laser of claim 31 in which the semiconductor layers comprise a pair of clad layers of opposite conductivity type and an active layer between the clad layers.

33. The diode laser of claim 32 further comprising a highly conductive semiconductor contact layer on one of the clad layers and the other mirror is on the contact layer.

34. The diode laser of claim 33 further comprising a contact region extending through the contact layer, one of the clad layers and the active layer to the other clad layer, a first conductive contact is on the contact region and a second conductive contact is on the contact layer.

35. The diode laser of claim 20 in which at least one of the optically passive means is partially reflective.

36. The diode laser of claim 20 in which the semiconductor layers comprise a pair of clad layers of opposite conductivity type and an active layer between the clad layers.

37. The diode laser of claim 36 in which at least one of the clad layers is heterogeneous.

38. The diode laser of claim 36 in which at least one of the clad layers is partially reflective.

39. The diode laser of claim 20 in which at least one of the mirrors has a substantially planar surface.

40. The diode laser of claim 20 in which at least one of the mirrors has a curved surface.

41. The diode laser of claim 20 in which at least one of the mirrors comprises alternating layers of at least two materials having different indices of refraction.

42. The diode laser of claim 41 in which the optically passive mans comprises at least one mirror in which the difference in indices of refraction of the layers are reduced such that the effective optical cavity length of the laser is increased to be at least 100 times the optical thickness of the active material in the active region.

43. The diode laser of claim 41 in which optically passive means comprises at least one spacer layer between the active region and at least one mirror in which the difference in indices of refraction of the layers are reduced, such that the effective optical cavity length of the laser is increased to be at least 100 times the optical thickness of the active material in the active region.

44. The diode laser of claim 41 in which the optically passive means comprises at least one interface layer in at least one mirror to increase the light penetration into the mirror such that the effective optical cavity length of the laser is increased to be at least 100 times the optical thickness of the active material in the active region.

45. The diode laser of claim 41 in which the optically passive means comprises at least one spacer layer between the active region and at least one interface layer in at least one mirror, such that the effective optical cavity length of the laser is increased to be at least 100 times the optical thickness of the active material in the active region.

46. The diode laser of claim 41 in which the optically passive means comprises at least one mirror in which the difference in indices of refraction of the layers are reduced, and at least one interface layer in at least one mirror, such that the effective optical cavity length of the laser is increased to be at least 100 times the optical thickness of the active material in the active region.

47. The diode laser of claim 41 in which the optically passive means comprises at least one spacer layer between the active region, at least one mirror in which the difference in indices of refraction of the layers are reduced, and at least one interface layer in at least one mirror, such that the effective optical cavity length of the laser is increased to be at least 100 times the optical thickness of the active material in the active region.

48. The diode laser of claim 41 in which the optically passive means comprises a cladding material surrounding at least part of at least one mirror, where the index of refraction of the cladding material is greater than the average of the indices of refraction of the mirror layers surrounded by the cladding.

49. The diode laser of claim 48 further comprising at least one optically passive spacer, or at least one mirror having reduced difference in indices of refraction of the layers, or at least one interface in at least one mirror, such that the effective optical cavity length of the laser is increased to be at least 100 times the optical thickness of the active material in the active region.

50. The diode laser of claim 1 further comprising multiple diode laser elements in an array.

51. The diode laser of claim 50 in which the light beams of at least two diode laser elements interact.

52. The diode laser of claim 51 in which the beams interact to produce at least partial locking of the phases of the beams.

* * * * *